United States Patent [19]
Hofer et al.

[11] Patent Number: 4,612,210
[45] Date of Patent: Sep. 16, 1986

[54] PROCESS FOR PLANARIZING A SUBSTRATE

[75] Inventors: Donald C. Hofer, San Martin; Debra B. LaVergne, Palo Alto; Robert J. Twieg; Willi Volksen, both of San Jose, all of Calif.

[73] Assignee: International Business Machines Corporation, Armonk, N.Y.

[21] Appl. No.: 759,030

[22] Filed: Jul. 25, 1985

[51] Int. Cl.$^4$ .................... B05D 5/12; B05D 3/02
[52] U.S. Cl. .................... 427/82; 427/385.5; 428/473.5
[58] Field of Search .............. 427/82, 385.5; 428/473.5

[56] References Cited

U.S. PATENT DOCUMENTS

| 3,882,085 | 5/1975 | Schmitt et al. | 260/65 |
| 4,347,286 | 8/1982 | Ishizuka et al. | 427/385.5 X |
| 4,467,000 | 8/1984 | Economy et al. | 427/385.5 |
| 4,503,285 | 3/1985 | Darms et al. | 428/473.5 X |
| 4,515,828 | 5/1985 | Economy et al. | 427/82 |
| 4,522,880 | 6/1985 | Klostermeier et al. | 427/385.5 X |
| 4,528,004 | 7/1985 | Makino et al. | 427/385.5 X |
| 4,533,574 | 8/1985 | Fryd et al. | 427/385.5 |

FOREIGN PATENT DOCUMENTS 1317321 5/1973 United Kingdom ............ 428/473.5

Primary Examiner—Thurman K. Page
Attorney, Agent, or Firm—Joseph G. Walsh

[57] ABSTRACT

A surface coating of high glass temperature and superior mechanical properties along with excellent planarization and gap filling is used to coat substrates. The coating comprises a polyamide alkyl ester from a pyromellitic alkyl diester and a para-linked aromatic diamine dissolved in a solvent containing at least 10% of a co-solvent boiling above 220° C.

8 Claims, No Drawings

PROCESS FOR PLANARIZING A SUBSTRATE

DESCRIPTION

1. Technical Field

The present invention is concerned with a process for planarizing a substrate. In particular, it is concerned with a process for obtaining not only a smooth upper surface, but also filling gaps or trenches in the substrate with an insulating coating which possesses heat stability and mechanical properties improved over those in the prior art.

2. Background Art

Polyimide coatings are known in the art. They are shown, for example, in U.S. Pat. No. 3,882,085 and U.S. Pat. No. 4,467,000. U.S. Pat. No. 4,515,828 also shows a process for coating a substrate with a planarizing layer. None of these patents, however, show the combination of ingredients and process steps required by the process of the present invention.

The prior art contains high glass transition temperature ($>340°$ C.) polyamides and polyimides with high thermal stability and mechanical elongation. These materials have poor local planarization. The art also contains examples of low glass transition temperature ($<320°$ C.) polyamides and polyimides which have excellent local planarization but poor mechanical elongation $<15\%$. The present invention describes a process for obtaining a planarization polymer with Tg $>340°$ C., mechanical elongation $>15\%$, and thermal stability of 0.06 wt % loss/hr, $N_2$, 400° C.

DISCLOSURE OF THE INVENTION

In the planarizing process of the present invention there is employed a polyamide alkyl ester formed from a pyromellitic alkyl diester and a para-linked aromatic diamine. The polyamide alkyl diester of the specified type is dissolved in a solvent which contains at least 10% of a co-solvent having a boiling point of at least 220° C., and then coated on the substrate. Curing of the composition on the substrate yields a very smooth film completely filling gaps in the substrate and having a very high degree of heat resistance and superior mechanical properties.

In the fabrication of integrated circuits, it is often necessary to coat a substrate, for example, a semiconductor chip such as a silicon chip, or a ceramic packaging module, with an electrically insulating coating. It is very desirable that the top surface of the coating be as smooth as possible, i. e., that these be a high degree of planarization. It is also desirable that gaps or trenches in the substrate be filled by the coating. The coatings applied by the process of the present invention meet these requirements very well, and also have the additional advantage over the prior art that they are very much more thermally stable with high glass temperatures, and have superior mechanical properties.

When reference is made to a pyromellitic alkyl diester, it is to be understood that the compound is one having an ester group on either side of the ring. Such diesters are commonly obtained by alcoholosis of pyromellitic dianhydride (PMDA). Preferred compounds include the dimethyl ester and the diisopropyl ester.

The polyamide alkyl ester is applied to the substrate in a solution. The solution should contain at least 10% of a co-solvent having a boiling point of 220° C. or higher. When such a co-solvent is not used, the excellent gap filling results are simply not obtained. One such preferred co-solvent is N-cyclohexylpyrrolidone (NCHP). The solvent should, of course, be non-reactive with the dissolved polyamide. Other useful high boiling cosolvents include N-methyl caprolactam, N-methyl piperidone, tetramethylene sulfone, and tetraethylene glycol dimethyl ether.

Several types of para-linked aromatic diamines may be used to form the polyamide alkyl esters used in the present invention. These include, for example, p-phenylene diamine; 4,4'-diamino phenyl sulfone; 4,4-diamino biphenyl; bis (4'-amino phenoxy)-1,4-benzene; 3,3',5,5'-tetramethyl benzidine, 4,4'-diamino octafluoro benzidine.

EXAMPLE 1

PMDA/ODA Polyamide Ethyl Ester

Preparation: A 500 ml resin kettle equipped with a mechanical stirrer, thermocouple well, gas inlet, and gas bubbler was charged with 10.42 gm (0.052 mole) of freshly sublimed p, p-oxydianiline (ODA) and 250 ml of dry N-methylpyrrolidone. The mixture was stirred at room temperature under an Argon flow until the diamine had complete dissolved. The temperature was now lowered via a dry-ice acetone bath to $-10°$ C. and 17.35 gm (0.050 mole) of diethyl pyromellitate diacyl chloride was now added gradually via solid addition funnel. When the acyl chloride addition was complete, vigorous stirring was continued for another hour at $-10°$ C. At this point, 11.1 gm (0.110 mole) of N-methylporpholine was added dropwise, maintaining the reaction temperature at $-10°$ C. After all all of tertiary amine had been added, the reaction temperature was allowed to equilibrate to room temperature over a period of approximately three hours. The polyamide ester solution was now precipitated in distilled water, employing a Waring blendor to finely disperse the polymer precipitate. The yellow polymer powder was filtered, resuspended in distilled water to continue washing and filtered again. This washing procedure was finally repeated with absolute ethanol, followed by vaccum drying at 50° C. for 24 hours. The yield of polyamide ester was nearly quantitative.

Formulation: The polyamide ethyl ester was best formulated by redissolution in a mixture of N-methylpyrrolidone and N-cyclohexylpyrrolidone in the ratio of 9/1, respectively. This yielded a final solids content of 20-30 wt %. The formulation obtained in this fashion was then filtered through a 1.0 um Millipore filter prior to coating experiments.

EXAMPLE 2

PMDA/BDAF Polyamide Methyl Ester

Preparation: 19.86 gm (0.0383 mole) of 2,2-bis(4-aminophenoxyphenyl)hexafluoropropane (4-BDAF) was dissolved in 275 ml of dry N-methypyrrolidone in a 500 ml resin kettle equipped with mechanical stirrer, thermocouple, well, gas inlet, and gas bubbler. Once dissolution was complete, the temperature was lowered to $-10°$ C. via a dry-ice acetone bath and 11.50 gm (0.0360 mole) of dimethyl pyromellitate diacyl chloride was added gradually while maintaining the reaction temperature at $-10°$ C. When the diacyl chloride addition was finished, the reaction was stirred for an additional hour at $-10°$ C., followed by dropwise addition of 7.30 gm (0.076 mole) of N-methylmorpholine. The reaction temperature was now allowed to reach ambient temperature over a period of three hours. The polyamide methyl ester solution was now precipitated in distilled water and worked up as described in Example 1. The yield was nearly quantitative.

Formulation: This material was best formulated as described in Example 1 by dissolution of the polymer in a mixture of N-methypyrrolidone/N-cyclohexylpyrrolidone=9/1 to produce solutions with solids contents of 25–30 wt %.

EXAMPLE 3

Amino Terminated PMDA/BDAF Oligoamide Ethyl Ester

Preparation: As described in the previous two examples, 38.89 gm (0.074 mole) of 4-BDAF was dissolved in 150 ml of N-methylpyrrolidone and reacted with 17.36 gm (0.050 mole) of diethyl pyromellitate diacyl chloride. The HCl generated during the polymerization was neutralized with 10.5 gm (0.105 mole) of N-methylmorpholine and the oligomeric amide ester was worked up as before yielding the product in nearly quantitative amounts. The use of such an oligomeric polyamide alkyl ester is one preferred variation of the present invention.

Formulation: 10.0 gm of P MDA/BDAF oligoamide ethyl ester and 1.92 gm (0.0045 mole) of di(ethylglycolyl)pyromellitate were dissolved in 22.14 gm of a mixture of N-methylpyrrolidone/N-cyclohexylpyrrolidone =9/1 to yield a final solids content of 35 wt %.

The PMDA based diester polyamide solution is spin, spray, or roller coated on a substrate. The planarizing coating is then cured by healing in an oven, hot plate, infrared oven, or microwave oven at a continuous ramp of 1°–10° C./min. to 350°–400° C. and maintained at this temperature for 15 minutes to one hour.

1. A process for covering a substrate with a planarizing coating, said process comprising (1) dissolving in a solvent containing at least 10% of a co-solvent boiling above 220° C., a polyamide alkyl ester formed from a pyromellitic alkyl diester and a para-linked aromatic diamine, (2) coating the substrate with the resulting solution and (3) curing the coating into a planarized layer which fills the gaps in the substrate.

2. A process as claimed in claim 1 wherein the high boiling co-solvent is N-cyclohexylpyrrolidone (NCHP).

3. A process as claimed in claim 1 wherein the polyamide alkyl ester is poly(4,4'-phenoxyphenylene pyromellitamide ethyl diester).

4. A process as claimed in claim 1 wherein the polyamide alkyl ester is poly(hexafluoroisopropylidine diphenoxyphenylene pyromellitamide ethyl diester).

5. A process as claimed in claim 1 in which the substrate is a semi-conductor chip.

6. A process as claimed in claim 1 in which the substrate is a silicon chip.

7. A process as claimed in claim 1 in which the substrate is a ceramic packaging module.

8. A process as claimed in claim 1 in which the polyamide alkyl ester is oligomeric.

* * * * *